(12) United States Patent
Tanaka

(10) Patent No.: US 11,749,620 B2
(45) Date of Patent: Sep. 5, 2023

(54) SEMICONDUCTOR MODULE

(71) Applicant: DENSO CORPORATION, Kariya (JP)

(72) Inventor: Junji Tanaka, Toyota (JP)

(73) Assignee: DENSO CORPORATION, Kariya (JP)

( * ) Notice: Subject to any disclaimer, the term of this patent is extended or adjusted under 35 U.S.C. 154(b) by 121 days.

(21) Appl. No.: 17/519,245

(22) Filed: Nov. 4, 2021

(65) Prior Publication Data

US 2022/0059474 A1 Feb. 24, 2022

Related U.S. Application Data

(63) Continuation of application No. PCT/JP2019/044173, filed on Nov. 11, 2019.

(30) Foreign Application Priority Data

May 14, 2019 (JP) .................. 2019-091197

(51) Int. Cl.
| | |
|---|---|
| H01L 23/31 | (2006.01) |
| H01L 23/485 | (2006.01) |
| H01L 29/16 | (2006.01) |
| H01L 29/45 | (2006.01) |
| H01L 29/739 | (2006.01) |
| H01L 29/78 | (2006.01) |
| H01L 23/00 | (2006.01) |

(52) U.S. Cl.
CPC ........ *H01L 23/562* (2013.01); *H01L 23/3135* (2013.01); *H01L 23/485* (2013.01); *H01L 29/1608* (2013.01); *H01L 29/45* (2013.01); *H01L 29/7395* (2013.01); *H01L 29/7827* (2013.01)

(58) Field of Classification Search
None
See application file for complete search history.

(56) References Cited

U.S. PATENT DOCUMENTS

| | | | | |
|---|---|---|---|---|
| 2002/0096710 A1* | 7/2002 | Inagawa | ............. | H01L 29/7808 257/725 |
| 2004/0262678 A1 | 12/2004 | Nakazawa et al. | | |
| 2005/0167746 A1 | 8/2005 | Nakazawa et al. | | |
| 2006/0180856 A1 | 8/2006 | Nakazawa et al. | | |
| 2014/0042530 A1* | 2/2014 | Cho | .................... | H01L 29/7811 438/270 |

FOREIGN PATENT DOCUMENTS

| | | |
|---|---|---|
| JP | 2014-011342 A | 1/2014 |
| JP | 2017-152655 A | 8/2017 |

\* cited by examiner

*Primary Examiner* — Bo B Jang

(74) *Attorney, Agent, or Firm* — POSZ LAW GROUP, PLC

(57) ABSTRACT

A semiconductor module includes: a semiconductor element; and a sealing member. The semiconductor element includes: a semiconductor substrate; a protection film on the semiconductor substrate; a metal film on the semiconductor substrate and having at least a part located between the semiconductor substrate and the protection film; and a dummy metal film on the semiconductor substrate between the metal film and the protection film. The surface of the semiconductor substrate has a recess. The protection film has an other recess or a hole. The dummy metal film is arranged in both the recess of the semiconductor substrate and the other recess or the hole of the protection film.

6 Claims, 6 Drawing Sheets

SEMICONDUCTOR MODULE

CROSS REFERENCE TO RELATED APPLICATION

The present application is a continuation application of International Patent Application No. PCT/JP2019/044173 filed on Nov. 11, 2019, which designated the U.S. and claims the benefit of priority from Japanese Patent Application No. 2019-091197 filed on May 14, 2019. The entire disclosures of all of the above applications are incorporated herein by reference.

TECHNICAL FIELD

The techniques disclosed herein relate to semiconductor modules.

BACKGROUND

In a semiconductor element according to a conceivable technique, a surface structure such as a plurality of metal films and a protective film covering the metal films is provided on the semiconductor substrate. The plurality of metal films include, for example, a main electrode and a signal wiring, which are provided adjacent to each other.

SUMMARY

According to an example, a semiconductor module includes: a semiconductor element; and a sealing member. The semiconductor element includes: a semiconductor substrate; a protection film on the semiconductor substrate; a metal film on the semiconductor substrate and having at least a part located between the semiconductor substrate and the protection film; and a dummy metal film on the semiconductor substrate between the metal film and the protection film. The surface of the semiconductor substrate has a recess. The protection film has an other recess or a hole. The dummy metal film is arranged in both the recess of the semiconductor substrate and the other recess or the hole of the protection film.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
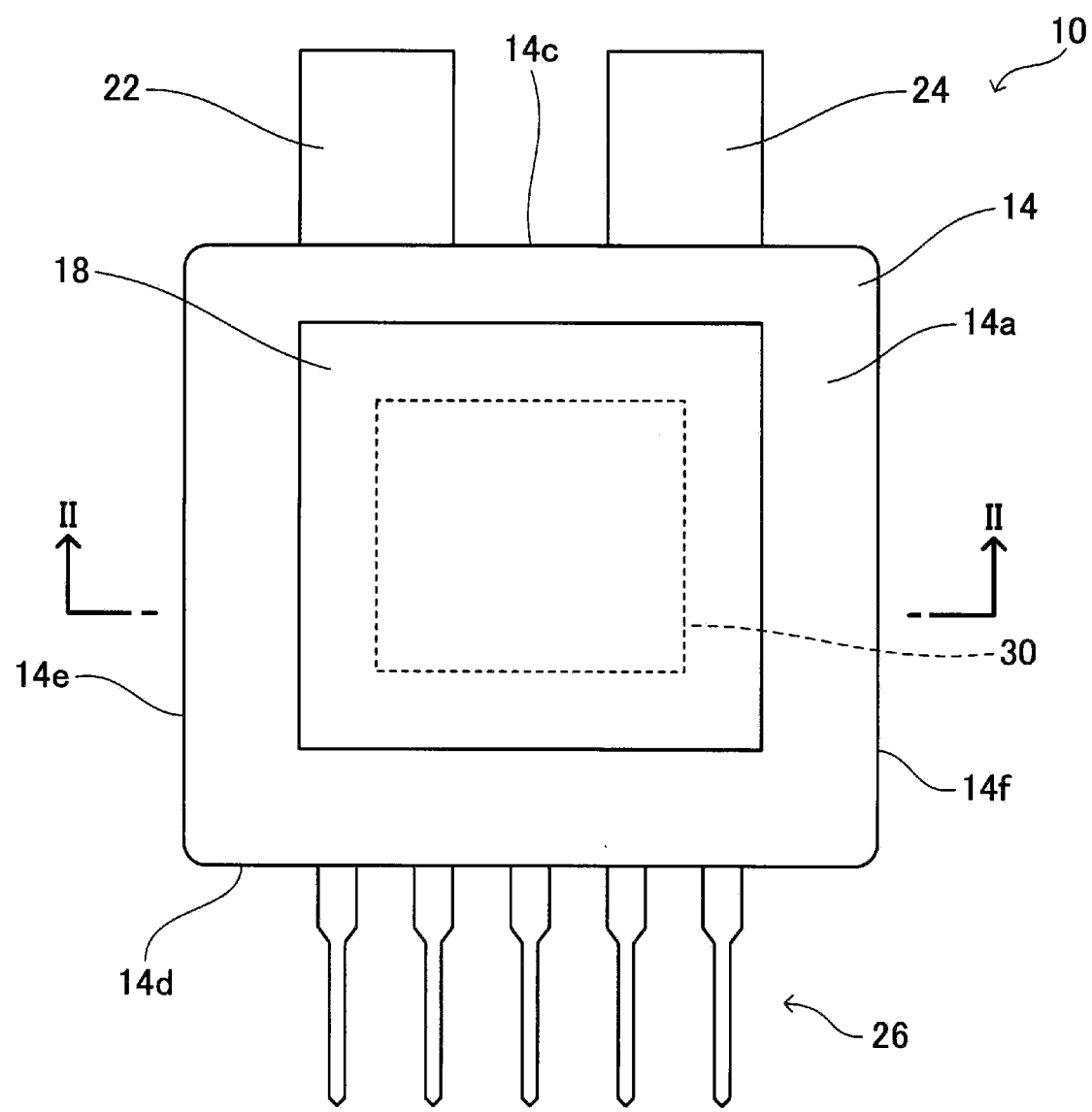
FIG. 1 is a plan view showing the appearance of the semiconductor module 10 of the embodiment.

The semiconductor element is incorporated in the semiconductor module and sealed inside the sealing body. In a semiconductor module, each component may be thermally deformed according to the temperature. At this time, a large shear stress may be likely to occur between the semiconductor substrate and the surface structure, and a large deformation (that is, plastic deformation) exceeding the elastic region may occur in the metal film such as the electrode and the signal wiring. If such deformation is repeated, peeling may occur between the semiconductor substrate and the surface structure, and a short circuit or insulation failure may occur between the plurality of metal films. Such a difficulty may be remarkable in a semiconductor module made of silicon carbide (i.e., SiC) having a relatively high Young's modulus, and countermeasures are required.

The semiconductor module disclosed in the present embodiments includes a semiconductor element and a sealing body for sealing the semiconductor element. The semiconductor element includes: a semiconductor substrate; a protection film arranged on the surface of the semiconductor substrate and extending in a frame shape along the outer peripheral edge of the semiconductor substrate; a metal film having at least a part thereof located between the semiconductor substrate and the protective film and arranged on the surface of the semiconductor substrate; and a dummy metal film provided on the surface of the semiconductor substrate and located between the metal film and the outer peripheral edge of the protection film. The surface of the semiconductor substrate is provided with a recess for accommodating a part of the dummy metal film. The protection film is provided with a recess or a hole facing the recess of the semiconductor substrate and accommodating a part of the dummy metal film. That is, the dummy metal film is provided in both the recess of the semiconductor substrate and the recess or hole of the protection film.

Usually, the peeling between the semiconductor substrate and the surface structure (e.g., the protection film or the metal film) starts from the peeling that occurs at the outer peripheral portion of the semiconductor element. That is, the peeling generated at the outer peripheral portion of the semiconductor element proceeds inward along the surface of the semiconductor substrate. Then, the peeling proceeds between the semiconductor substrate and the surface structure and reaches, for example, a metal film, so that deformation of the metal film and a short circuit and the like may be generated. Based on this finding, in the above-mentioned semiconductor module, a dummy metal film is provided between the metal film and the outer peripheral edge of the protection film. This dummy metal film is located over both the semiconductor substrate and the protection film, and functions as a wall that prevents the progress of the above-mentioned peeling. As a result, even if the peeling that occurs on the outer peripheral portion of the semiconductor element progresses between the semiconductor substrate and the surface structure, it is possible to prevent the peeling from reaching the metal film.

In one embodiment of the present technology, the dummy metal film may be made of two or more metal materials having different hardness. By using two or more metal materials, a dummy metal film having various properties can be realized.

In the above-described embodiment, the dummy metal film may have a first metal layer and a second metal layer provided on the first metal layer. In this case, the hardness of the metal material constituting the second metal layer may be higher than the hardness of the metal material constituting the first metal layer. Further, both the first metal layer and the second metal layer may be provided over both the recess of the semiconductor substrate and the recess or hole of the protection film.

In one embodiment of the present technology, the semiconductor element may be provided on the surface of the semiconductor substrate and may further include an insulation film located between the semiconductor substrate and the metal film. In this case, the dummy metal film may be provided along the outer peripheral edge of the insulation film. According to such a configuration, it is possible to effectively suppress the peeling generated in the outer peripheral portion of the semiconductor element from proceeding along the insulation film between the semiconductor substrate and the metal film.

In one embodiment of the present technology, the dummy metal film may be provided along at least four corners of the semiconductor substrate. At the four corners of the semiconductor substrate, stress due to thermal deformation tends to increase locally, and peeling occurs and progresses remarkably. Therefore, by providing the dummy metal film on such a corner portion, the progress of peeling can be effectively suppressed.

In one embodiment of the present technology, the dummy metal film may surround along the outer peripheral edge of the semiconductor substrate. According to such a configuration, it is possible to more reliably suppress the peeling generated in the outer peripheral portion of the semiconductor element from proceeding to the position of the metal film.

In one embodiment of the present technology, the dummy metal film may also function as a signal wiring for transmitting a signal. In other words, by giving the configuration of the dummy metal film described above to the existing signal wiring, the signal wiring can also be used as the dummy metal film.

Embodiments

The semiconductor module 10 of the embodiment will be described with reference to FIGS. 1 to 4. The semiconductor module 10 of this embodiment is adopted in, for example, a power control device for an electric vehicle, and can form a part of a power conversion circuit such as a converter or an inverter. The electric vehicle in the present embodiments broadly means a vehicle having a motor for driving wheels, and for example, an electric vehicle charged by an external electric power, a hybrid vehicle having an engine in addition to the motor, a fuel cell vehicle having a fuel cell as the power source and the like.

Figure 2:
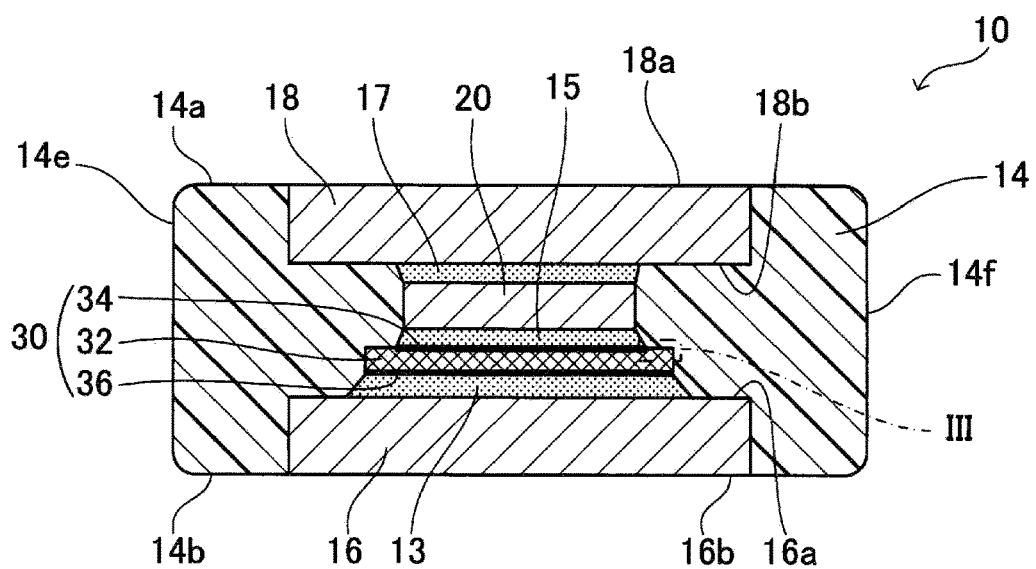
FIG. 2 is a cross-sectional view taken along the line II-II in FIG. 1.

As shown in FIGS. 1 and 2, the semiconductor module 10 includes a semiconductor element 30 and a sealing member 14 that seals the semiconductor element 30. The sealing member 14 is made of an insulation material. Although not particularly limited, the sealing member 14 in this embodiment is made of a sealing material such as an epoxy resin, and an additive such as silica is disposed therein. The sealing member 14 generally has a plate shape, and has an upper surface 14a, a lower surface 14b, a first end surface 14c, a second end surface 14d, a first side surface 14e, and a second side surface 14f.

The semiconductor element 30 is a power semiconductor element and has a semiconductor substrate 32, an upper surface electrode 34, and a lower surface electrode 36. The upper surface electrode 34 is located on the upper surface of the semiconductor substrate 32, and the lower surface electrode 36 is located on the lower surface of the semiconductor substrate 32. The upper surface electrode 34 and the lower surface electrode 36 are electrically connected to each other via the semiconductor substrate 32. Although not particularly limited, the semiconductor element 30 in this embodiment is a switching element, and can selectively conduct and cut off between the upper surface electrode 34 and the lower surface electrode 36. The type of the semiconductor substrate 32 is not particularly limited. The semiconductor substrate 32 may be, for example, a silicon substrate, a silicon carbide substrate, or a nitride semiconductor substrate. The upper surface electrode 34 and the lower surface electrode 36 can be configured by using one or more kinds of metals such as aluminum, nickel or gold. As an example, the upper surface electrode 34 and the lower surface electrode 36 in this embodiment have a stacking structure in which a nickel layer is provided on an aluminum alloy (for example, an aluminum-silicon alloy) layer.

As an example, the semiconductor element 30 in this embodiment is a MOSFET (Metal-Oxide-Semiconductor Field-Effect Transistor), and a silicon carbide (SiC) substrate is used for the semiconductor substrate 32. The upper surface electrode 34 is connected to the source of the MOSFET structure configured in the semiconductor substrate 32, and the lower surface electrode 36 is connected to the drain of the MOSFET structure. The semiconductor element 30 may be an IGBT (Insulated Gate Bipolar Transistor) or an RC (Reverse Conducting)-IGBT. In this case, the upper surface electrode 34 is connected to the emitter of the IGBT configured in the semiconductor substrate 32, and the lower surface electrode 36 is connected to the collector of the IGBT structure. The type and specific structure of the semiconductor element 30 are not limited to those described here, and can be changed in various ways. Further, the semiconductor module 10 may have two or more semiconductor elements such as a combination of a MOSFET (or IGBT) and a diode.

The semiconductor module 10 further includes a first conductor plate 16 and a second conductor plate 18. The first conductor plate 16 and the second conductor plate 18 face each other with the semiconductor element 30 interposed therebetween. The first conductor plate 16 and the second conductor plate 18 are made of a conductor such as metal. The first conductor plate 16 and the second conductor plate 18 are integrally held by the sealing member 14. The upper surface 16a of the first conductor plate 16 is located inside the sealing member 14, and is bonded to the lower surface electrode 36 of the semiconductor element 30 via the solder layer 13. On the other hand, the lower surface 16b of the first conductor plate 16 is exposed on the lower surface 14b of the sealing member 14. As a result, the first conductor plate 16 constitutes a part of the circuit electrically connected to the semiconductor element 30, and also functions as a heat radiation plate that releases the heat of the semiconductor element 30 to the outside.

The lower surface 18b of the second conductor plate 18 is located inside the sealing member 14, and is connected to the upper surface electrode 34 of the semiconductor element 30 via the conductor spacer 20. The lower surface 18b of the second conductor plate 18 is bonded to the conductor spacer 20 via the solder layer 17, and the conductor spacer 20 is bonded to the upper surface electrode 34 of the semiconductor element 30 via the solder layer 15. On the other hand, the upper surface 18a of the second conductor plate 18 is exposed on the upper surface 14a of the sealing body 14. Similar to the first conductor plate 16, the second conductor plate 18 constitutes a part of a circuit electrically connected to the semiconductor element 30, and also functions as a heat radiation plate that releases heat of the semiconductor element 30 to the outside.

The semiconductor module 10 includes a first power terminal 22, a second power terminal 24, and a plurality of signal terminals 26. The first power terminal 22 and the second power terminal 24 protrude from the first end surface 14c of the sealing member 14. The first power terminal 22 is electrically connected to the first conductor plate 16 inside the sealing member 14, and the second power terminal 24 is electrically connected to the second conductor plate 18 inside the sealing member 14. As a result, the first power terminal 22 and the second power terminal 24 are electrically connected via the semiconductor element 30. The plurality of signal terminals 26 project from the second end surface 14d of the sealing member 14. Each signal terminal 26 is electrically connected to the signal pad 38 (see FIG. 4) of the semiconductor element 30 by a bonding wire, for example.

Figure 3:
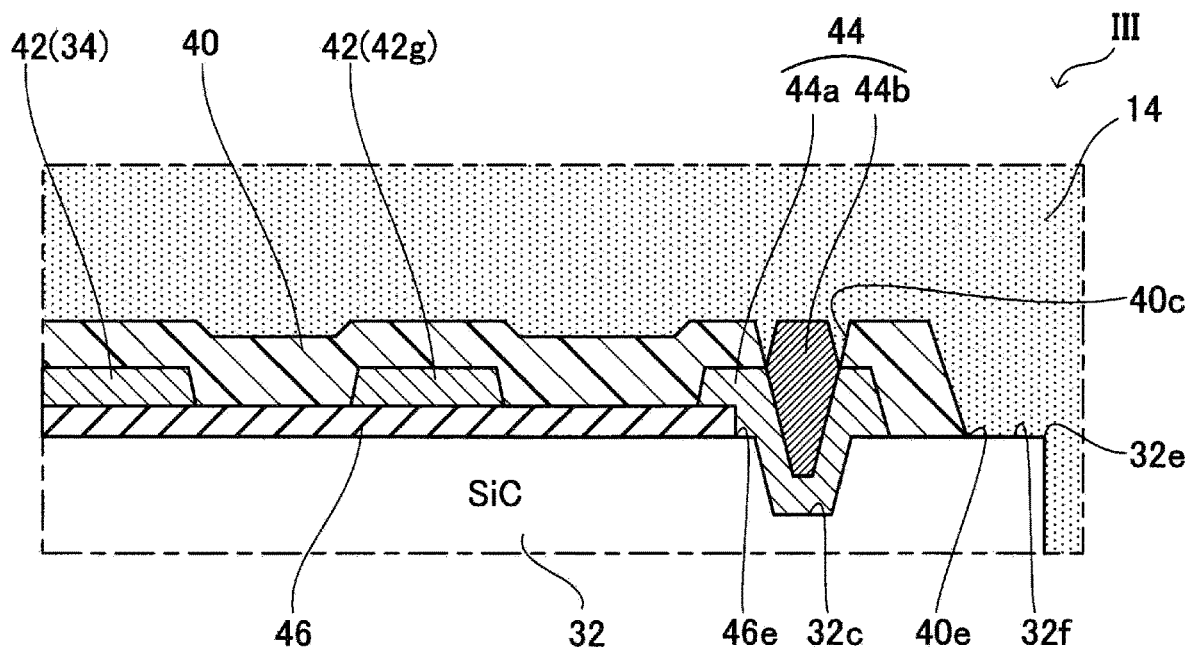
FIG. 3 is an enlarged view of part III in FIG. 2.
Figure 4:
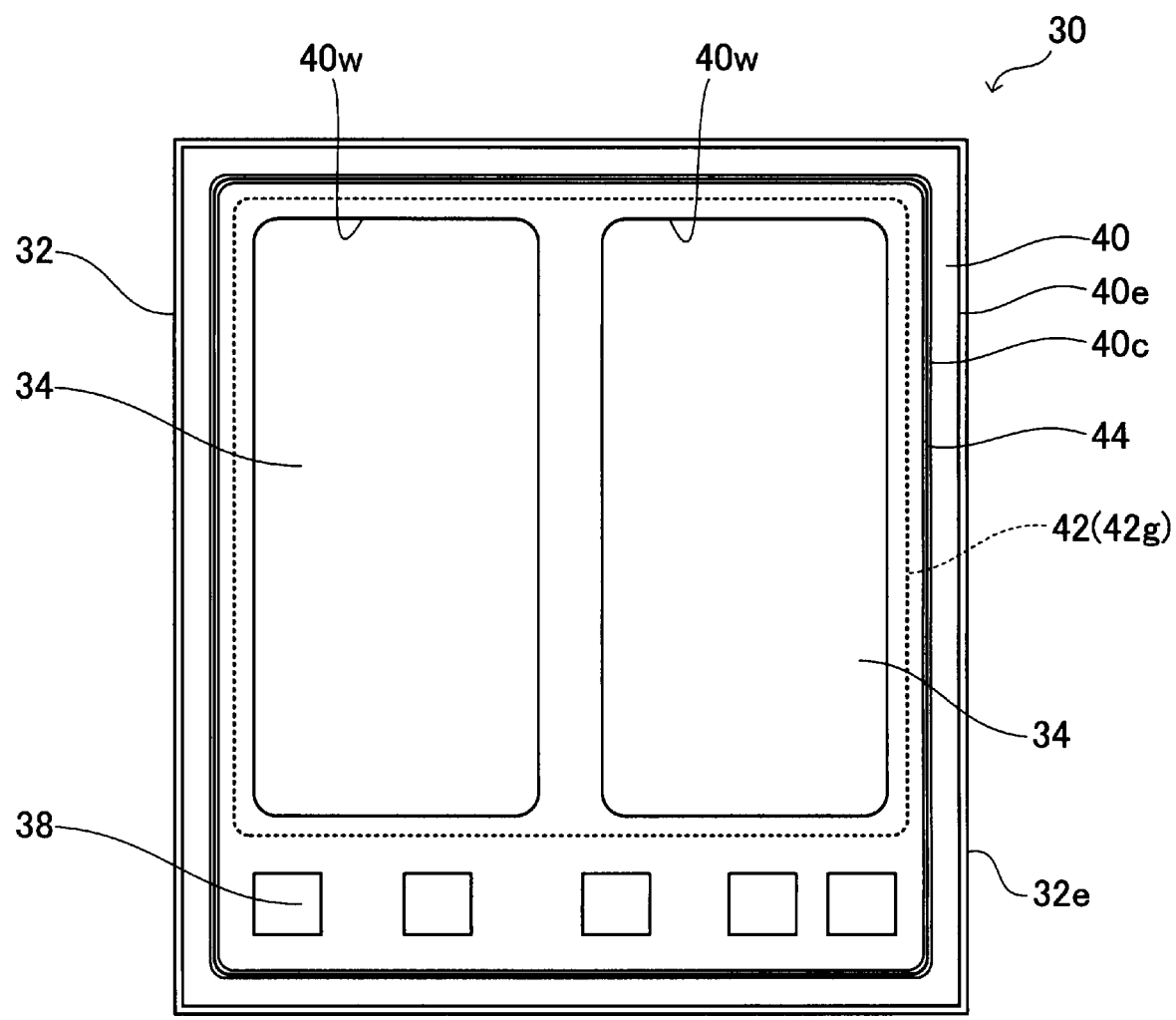
FIG. 4 is a plan view of the semiconductor element 30.

Next, details of the semiconductor element 30 will be described with reference to FIGS. 3 and 4. As shown in FIGS. 3 and 4, the semiconductor element 30 has a protection film 40 provided on the surface 32f of the semiconductor substrate 32 and a plurality of metal films 42 provided between the semiconductor substrate 32 and the protection film 40. The protection film 40 is made of an insulator, and although it is an example, a polyimide resin is used in this embodiment. The protection film 40 is provided in a frame shape along the outer peripheral edge 32e of the semiconductor substrate 32, and provides an opening 40w that exposes the upper surface electrode 34.

The plurality of metal films 42 include a gate wiring 42g and the like in addition to the above-mentioned upper surface electrode 34. The gate wiring 42g is a transmission line for a gate signal input from the outside, and is connected to a gate in a MOSFET structure provided on the semiconductor substrate 32. The gate wiring 42g is provided along the peripheral edge of the upper surface electrode 34 and surrounds the upper surface electrode 34 in a plan view. The gate wiring 42g is made of an aluminum alloy. However, the material constituting the gate wiring 42g and the other metal film 42 may not be limited to the aluminum alloy. An insulation film 46 (for example, made of a silicon oxide film) is formed between the semiconductor substrate 32 and the metal film 42, and the metal film 42 (other than the upper surface electrode 34) is electrically insulated from the semiconductor substrate 32.

The semiconductor element 30 further includes a dummy metal film 44. The dummy metal film 44 is made of a metal material. The dummy metal film 44 is provided on the surface 32f of the semiconductor substrate 32, and is located between the metal film 42 (here, the gate wiring 42g) and the outer peripheral edge 40e of the protection film 40. Although not particularly limited, the dummy metal film 44 in this embodiment is provided along the outer peripheral edge 46e of the insulation film 46, and surrounds along the outer peripheral edge 32e of the semiconductor substrate 32.

The dummy metal film 44 is formed in a wedge shape over both the semiconductor substrate 32 and the protection film 40. That is, the surface 32f of the semiconductor substrate 32 is provided with a recess 32c for accommodating a part of the dummy metal film 44. Further, the protection film 40 is provided with a hole 40c facing the recess 32c of the semiconductor substrate 32 and accommodates a part of the dummy metal film 44. The dummy metal film 44 is located over both the recess 32c of the semiconductor substrate 32 and the hole 40c of the protection film 40.

In a semiconductor module 10, each component may be thermally deformed according to the temperature. At this time, a large shear stress may be likely to occur between the semiconductor substrate 32 and the surface structure (e.g., the protection film 40 or the metal film 42), and the metal film 42 such as the upper surface electrode 34 and the gate wiring 42g may have a large elastic deformation (i.e., plastic deformation) exceeding the elastic region. If such deformation is repeated, peeling may occur between the semiconductor substrate 32 and the surface structure, and a short circuit or insulation failure may occur between the plurality of metal films 42. Such a difficulty may remarkably appear in the semiconductor module 10 of the present embodiment in which silicon carbide (i.e., SiC) having a relatively high Young's modulus is used.

Figure 5:
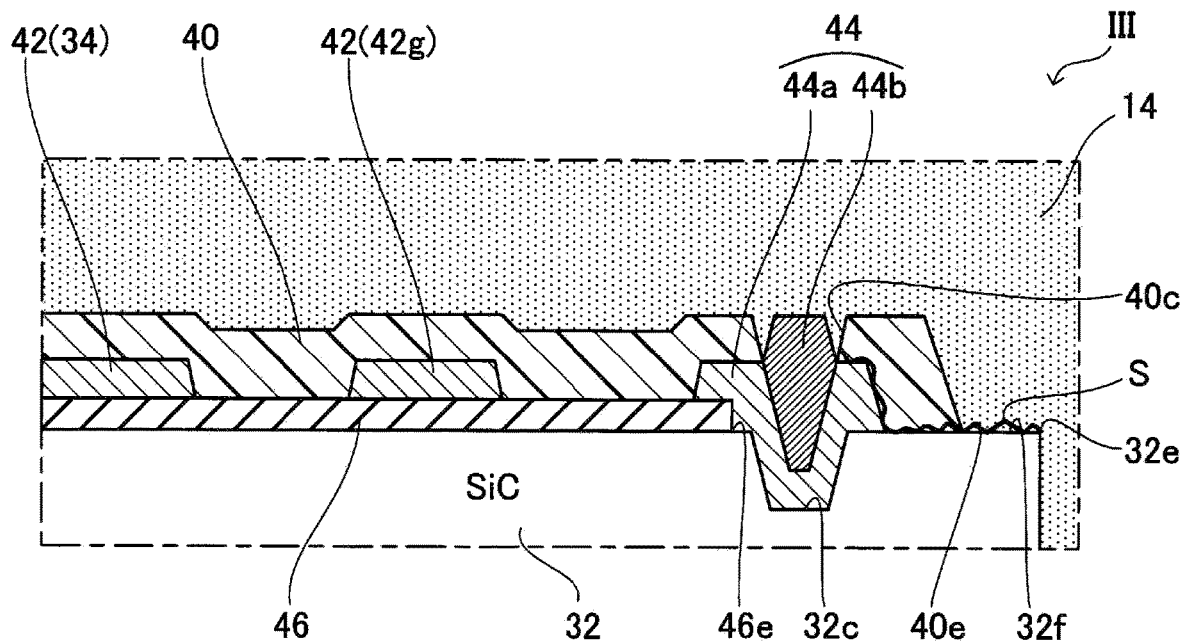
FIG. 5 is a diagram showing an example of peeling S occurring in the semiconductor module 10.

As shown in FIG. 5, the peeling between the semiconductor substrate 32 and the surface structure (e.g., the protective film 40 or the metal film 42) usually starts from the peeling S generated at the outer peripheral portion of the semiconductor element 30 as a starting point. That is, the peeling S generated at the outer peripheral portion of the semiconductor element 30 proceeds inward along the surface 32f of the semiconductor substrate 32. Then, the peeling S proceeds between the semiconductor substrate 32 and the surface structure, and reaches the metal film 42 such as the gate wiring 42g and the upper surface electrode 34, so that the deformation of the metal film 42 and a short circuit associated therewith may occur. Based on this finding, in the above-mentioned semiconductor module 10, a dummy metal film 44 is provided between the metal film 42 and the outer peripheral edge 40e of the protection film 40. This dummy metal film 44 is located over both the semiconductor substrate 32 and the protection film 40, and functions as a wall that prevents the progress of the above-mentioned peeling S. As a result, even if the peeling S that occurs on the outer peripheral portion of the semiconductor element 30 progresses between the semiconductor substrate 32 and the surface structure, it is possible to prevent the peeling S from reaching the metal film 42.

As an example, the dummy metal film 44 in this embodiment has a first metal layer 44a and a second metal layer 44b provided on the first metal layer 44a. The first metal layer 44a is made of an aluminum alloy (for example, an aluminum-silicon alloy), and the second metal layer 44b is made of nickel. Here, the hardness of nickel constituting the second metal layer 44b is higher than the hardness of the aluminum-based alloy constituting the first metal layer 44a. As described above, the dummy metal film 44 in this embodiment has a two-layer structure and is made of two or more metal materials having different hardness. Both the first metal layer 44a and the second metal layer 44b are provided over both the recess 32c of the semiconductor substrate 32 and the hole 40c of the protective film 40.

Figure 6:
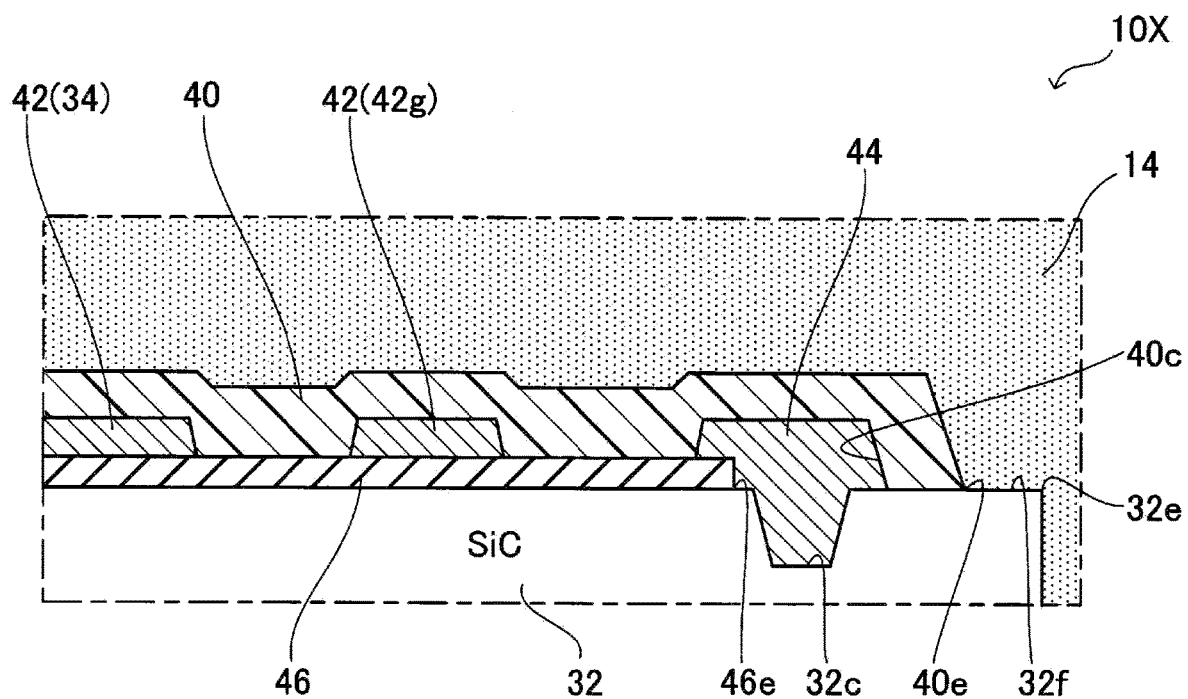
FIG. 6 is a cross-sectional view showing a main part (corresponding to FIG. 3) of the semiconductor module 10X according to one modification.
Figure 7:
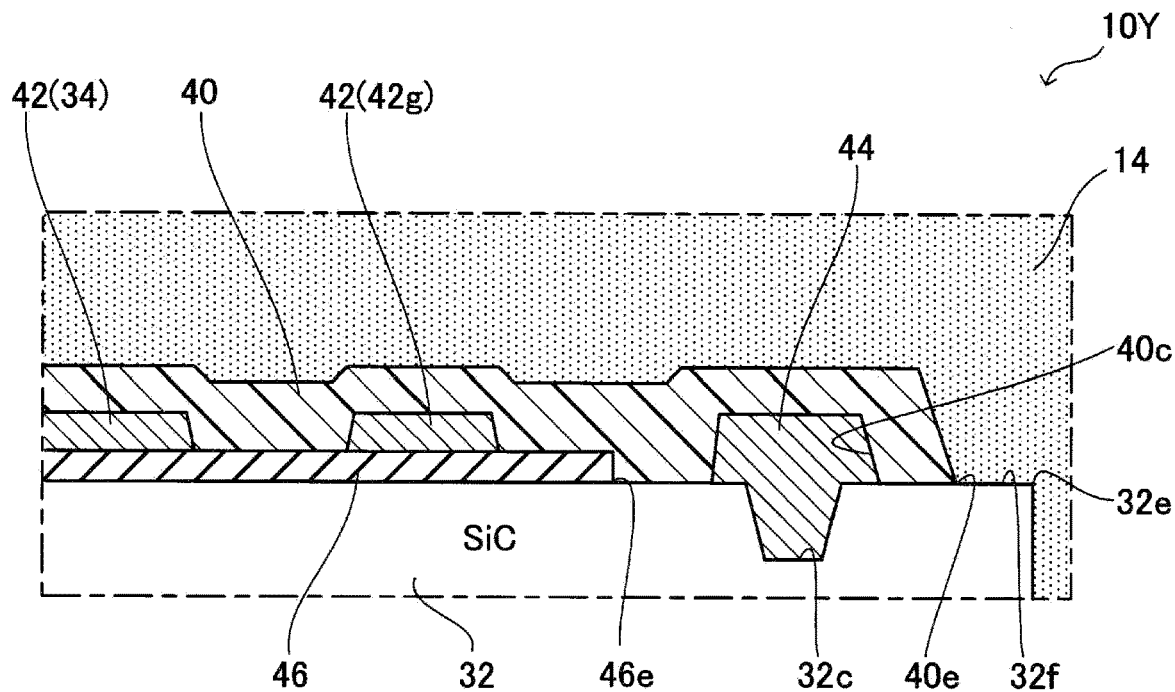
FIG. 7 is a cross-sectional view showing a main part (corresponding to FIG. 3) of the semiconductor module 10Y according to one modification.

Here, the metal material constituting the dummy metal film 44 may not be limited to an aluminum alloy, nickel, or the like. Further, the dummy metal film 44 may be made of a single metal material, or may be made of three or more metal materials. For example, as shown in FIG. 6, in the semiconductor module 10X of one modification, the dummy metal film 44 is made of a single metal material. In this modification, the dummy metal film 44 is covered with the protection film 40, and the protection film 40 is provided with a bottomed hole 40*c* (that is, a recess) for accommodating a part of the dummy metal film 44. Further, the position where the dummy metal film 44 is provided may not be limited to the position of the outer peripheral edge 46*e* of the insulation film 46, and can be appropriately changed. For example, as shown in FIG. 7, in the semiconductor module 10Y of another modification, the dummy metal film 44 is provided at a position away from the outer peripheral edge 46*e* of the insulation film 46.

Figure 8:
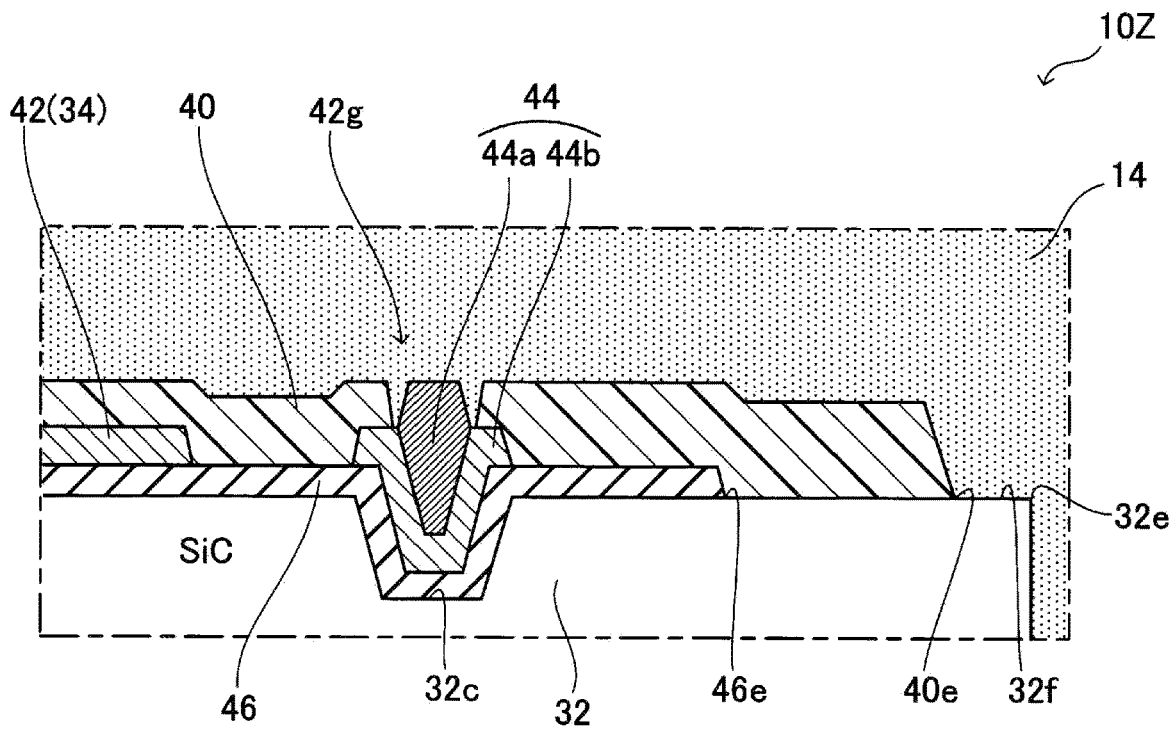
FIG. 8 is a cross-sectional view showing a main part (corresponding to FIG. 3) of the semiconductor module 10Z according to one modification.

As shown in FIG. 8, in the semiconductor module 10Z of another modification, the configuration of the dummy metal film 44 described above may be applied to the gate wiring 42*g*. As a result, the gate wiring 42*g* can function as the dummy metal film 44. According to such a configuration, it is not necessary to separately provide the dummy metal film 44, so that the size of the semiconductor element 30 can be minimized.

Figure 9:
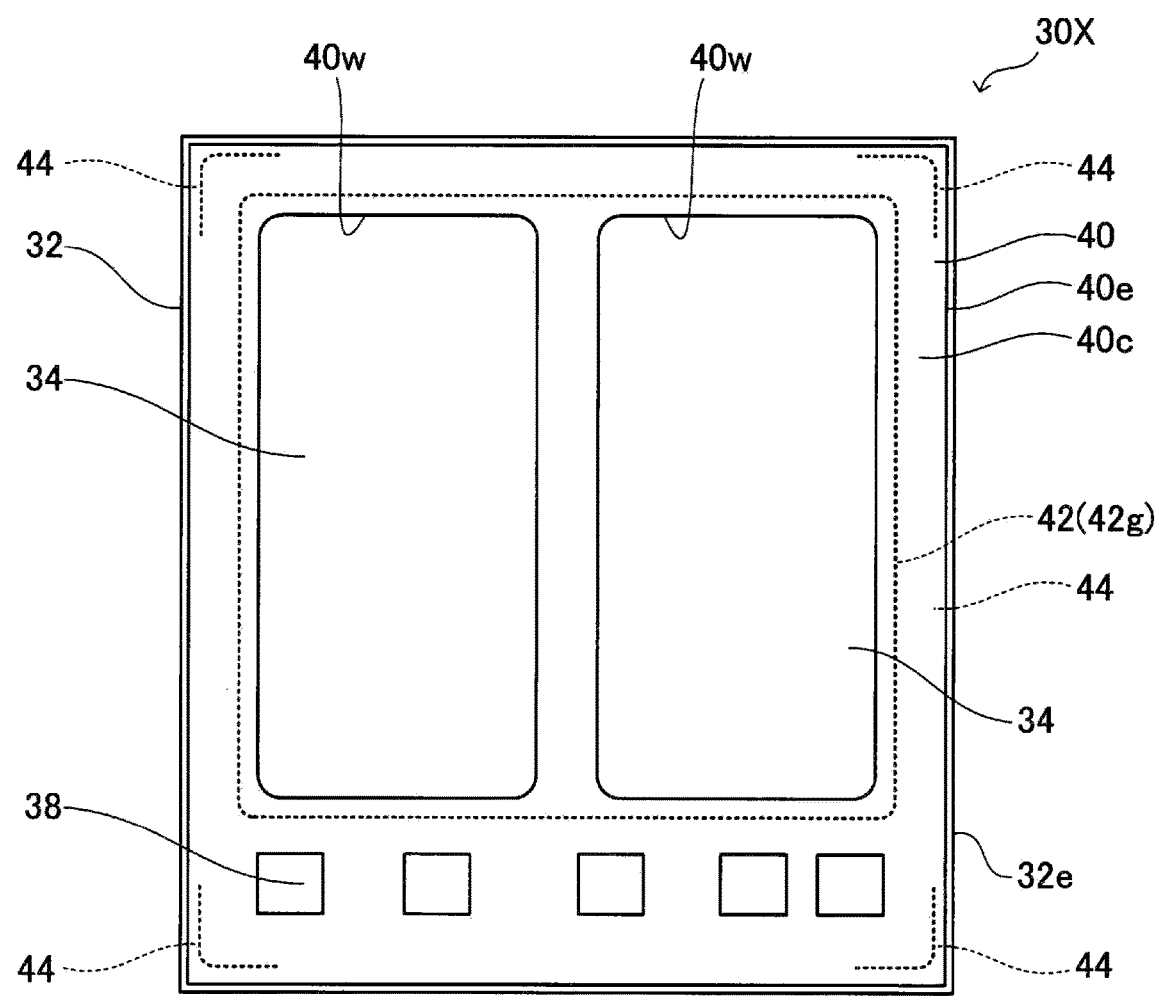
FIG. 9 is a plan view of a semiconductor element 30X according to one modification.

In the semiconductor modules 10, 10X, 10Y, and 10Z of the above-described embodiments, the dummy metal film 44 of the semiconductor element 30 is provided so as to surround along the outer peripheral edge 32*e* of the semiconductor substrate 32. On the other hand, as in the semiconductor element 30X shown in FIG. 9, the dummy metal film 44 may be provided only in a range along the four corners of the semiconductor substrate 32. At the four corners of the semiconductor substrate 32, stress due to thermal deformation tends to increase locally, and peeling S occurs and progresses remarkably. Therefore, by providing the dummy metal film 44 on such a corner portion, the progress of peeling S can be effectively suppressed. In addition to or instead of such a dummy metal film 44, the structure of the dummy metal film 44 may be applied to the four corners of the gate wiring 42*g*.

Although specific examples of the techniques disclosed in the present specification have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. The techniques illustrated in the present specification or drawings can achieve a plurality of objectives at the same time, and achieving one of the objectives itself has technical usefulness.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor module comprising:
a semiconductor element; and
a sealing member that seals the semiconductor element, wherein:
the semiconductor element includes:
a semiconductor substrate;
a protection film arranged on a surface of the semiconductor substrate and extending in a frame shape along an outer peripheral edge of the semiconductor substrate;
a metal film arranged on the surface of the semiconductor substrate and having at least a part located between the semiconductor substrate and the protection film; and
a dummy metal film arranged on the surface of the semiconductor substrate and located between the metal film and an outer peripheral edge of the protection film;
the surface of the semiconductor substrate has a recess for accommodating a part of the dummy metal film;
the protection film has an other recess or a hole facing the recess of the semiconductor substrate and accommodating an other part of the dummy metal film;
the dummy metal film is arranged in both the recess of the semiconductor substrate and the other recess or the hole of the protection film;
the dummy metal film includes a first metal layer and a second metal layer arranged on the first metal layer;
a hardness of a metal material providing the second metal layer is higher than a hardness of a metal material providing the first metal layer; and
both the first metal layer and the second metal layer are arranged in both the recess of the semiconductor substrate and the other recess or the hole of the protection film.

2. The semiconductor module according to claim 1, wherein:
the dummy metal film is made of two or more metal materials having different hardness.

3. The semiconductor module according to claim 1, further comprising:
an insulation film arranged on the surface of the semiconductor substrate, and located between the semiconductor substrate and the metal film, wherein:
the dummy metal film is arranged along an outer peripheral edge of the insulation film.

4. The semiconductor module according to claim 1, wherein:
the dummy metal film is arranged along at least four corners of the semiconductor substrate.

5. The semiconductor module according to claim 1, wherein:
the dummy metal film surrounds along the outer peripheral edge of the semiconductor substrate.

6. The semiconductor module according to claim 1, wherein:
the dummy metal film functions as a signal wiring for transmitting a signal.

\* \* \* \* \*